US012651106B2

(12) United States Patent
Chen et al.

(10) Patent No.: US 12,651,106 B2
(45) Date of Patent: Jun. 9, 2026

(54) AUTOMATIC COMPILATION METHOD AND FRAMEWORK FOR GENERATING A LAYOUT OF INTEGRATED MEMORY-COMPUTE CIRCUIT

(71) Applicant: AI Chip Center for Emerging Smart Systems Limited, Hong Kong (HK)

(72) Inventors: Jia Chen, Hong Kong (HK); Fengbin Tu, Hong Kong (HK); Xiao Huo, Hong Kong (HK)

(73) Assignee: AI Chip Center for Emerging Smart Systems Limited, Hong Kong (HK)

( * ) Notice: Subject to any disclaimer, the term of this patent is extended or adjusted under 35 U.S.C. 154(b) by 631 days.

(21) Appl. No.: 18/327,041

(22) Filed: May 31, 2023

(65) Prior Publication Data

US 2024/0403527 A1     Dec. 5, 2024

(51) Int. Cl.
*G06F 30/3323*     (2020.01)
*G06F 30/347*     (2020.01)
(Continued)

(52) U.S. Cl.
CPC ........ *G06F 30/3323* (2020.01); *G06F 30/347* (2020.01); *G06F 30/337* (2020.01);
(Continued)

(58) Field of Classification Search
CPC .. G06F 30/3323; G06F 30/347; G06F 30/337; G06F 30/367; G06F 30/373; G06F 30/394; G06F 30/398
(Continued)

(56) References Cited

U.S. PATENT DOCUMENTS 8,370,784 B2     2/2013  Padmanabhan et al.
9,177,624 B1     11/2015  Wu et al.
(Continued)

OTHER PUBLICATIONS

Ali et al., "Compute=in-Memory Technologies and Architectures for Deep Learning Workloads", IEEE Transactions on Very Large Scale Integration (VLSI) Systems, vol. 30, No. 11, Nov. 2022, pp. 1615-1630. (Year: 2022).*
(Continued)

*Primary Examiner* — Phallaka Kik
(74) *Attorney, Agent, or Firm* — IDEA Intellectual Limited; Sam T. Yip

(57) ABSTRACT

An automatic compilation method and framework for generating a layout for an integrated memory-compute circuit design is provided. The automatic compilation method comprises: constructing a design database with at least one basic design library and a collection of referencing architecture templates; receiving a user specification associated with the integrated memory-compute circuit design; selecting a referencing architecture template from the design database and parameterizing the selected architecture template according to the received user specification to generate an architecture for the integrated memory-compute circuit design; generating a physical layout based on the generated architecture according to one or more placement-and-routing algorithms; iterating a design exploration loop on the generated layout with one or more expertise experience-based optimization schemes to obtain one or more explored physical layouts; and evaluating hardware metrics of the one or more explored physical layouts to determine an optimal physical layout.

20 Claims, 9 Drawing Sheets

(51) Int. Cl.
    _G06F 30/367_        (2020.01)
    _G06F 30/373_        (2020.01)
    _G06F 30/394_        (2020.01)
    _G06F 30/398_        (2020.01)
    _G06F 30/337_        (2020.01)

(52) U.S. Cl.
    CPC .......... _G06F 30/367_ (2020.01); _G06F 30/373_
            (2020.01); _G06F 30/394_ (2020.01); _G06F_
                                        _30/398_ (2020.01)

(58) Field of Classification Search
    USPC ........... 716/122, 106, 111, 126, 132; 703/15
    See application file for complete search history.

(56)                    References Cited

U.S. PATENT DOCUMENTS

| | | | | |
|---|---|---|---|---|
| 9,256,706 | B2 | 2/2016 | Chen et al. | |
| 10,460,056 | B2 | 10/2019 | Gharia | |
| 11,010,528 | B2 | 5/2021 | Chen et al. | |
| 11,176,991 | B1 * | 11/2021 | Shaik | G06F 7/5443 |
| 11,694,007 | B2 * | 7/2023 | Mason | G06F 30/327 |
| | | | | 716/119 |
| 2006/0107247 | A1 * | 5/2006 | Andreev | G06F 30/392 |
| | | | | 716/103 |
| 2007/0113212 | A1 * | 5/2007 | Andreev | G11C 5/025 |
| | | | | 716/122 |
| 2011/0296364 | A1 * | 12/2011 | Chen | H10D 89/10 |
| | | | | 716/122 |
| 2013/0346926 | A1 | 12/2013 | Pandurangan et al. | |
| 2015/0012902 | A1 * | 1/2015 | Zhao | G06F 30/18 |
| | | | | 716/127 |
| 2021/0247978 | A1 * | 8/2021 | Malladi | G06F 9/3001 |
| 2021/0279039 | A1 * | 9/2021 | Srivastava | G11C 11/54 |
| 2021/0383051 | A1 * | 12/2021 | Srinivasan | G06F 30/398 |
| 2022/0066928 | A1 * | 3/2022 | Tavallaei | G06F 12/123 |
| 2022/0171911 | A1 * | 6/2022 | DiCorpo | G06F 30/323 |
| 2022/0392524 | A1 * | 12/2022 | Chen | G06N 3/063 |
| 2023/0074229 | A1 * | 3/2023 | Jia | G06F 15/7821 |
| 2023/0325257 | A1 * | 10/2023 | Varadan | G06F 3/0604 |
| | | | | 718/105 |
| 2024/0004646 | A1 * | 1/2024 | Malladi | G06F 9/3001 |
| 2024/0330178 | A1 * | 10/2024 | Verma | G06F 12/0607 |
| 2025/0190216 | A1 * | 6/2025 | Malladi | G06F 9/3001 |

OTHER PUBLICATIONS

Zhout et al., "A Customized NoC Architecture to Enable Highly Localized Computing-on-the-Move DNN Dataflow", IEEE Transactions on Circuits and Systems,—II: Express Briefs, vol. 69, No. 3, Mar. 2022, pp. 1692-1696. (Year: 2022).*

Yu-Der Chih et al. 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference, 2021, 252-254.

Matthew R. Guthaus et al. OpenRAM: An Open-Source Memory Compiler, 2016 IEEE/ACM International Conference on Computer-Aided Design, 2016, 1-6.

Mingjie Liu et al. OpenSAR: An Open Source Automated End-to-end SAR ADC Compiler. 2021 IEEE/ACM International Conference on Computer-Aided Design, 2021, 1-9.

Hidehiro Fujiwara et al. A 5-nm 254-TOPS/W 221-TOPS/mm2 Fully-Digital Computing-in-Memory Macro Supporting Wide-Range Dynamic-Voltage-Frequency Scaling and Simultaneous MAC and Write Operations, 2022 IEEE International Solid-State Circuits Conference, 2022, 65, 1-3.

Dewei Wang et al. DIMC: 2219TOPS/W 2569F2/b Digital In-Memory Computing Macro in 28nm Based on Approximate Arithmetic Hardware, 2022 IEEE International Solid-State Circuits Conference, 2022, 65, 266-268.

Fengbin Tu et al. A 28nm 29.2 Tflops/W BF16 and 36.5 TOPS/W INT8 Reconfigurable Digital CIM Processor with Unified FP/INT Pipeline and Bitwise In-Memory Booth Multiplication for Cloud Deep Learning Acceleration, 2022 IEEE International Solid-State Circuits Conference, 2022, 65, 1-3.

Fengbin Tu et al. A 28nm 15.59μJ/Token Full-Digital Bitline-Transpose CIM-Based Sparse Transformer Accelerator with Pipeline/Parallel Reconfigurable Modes, 2022 IEEE International Solid-State Circuits Conference, 2022, 65, 466-468.

Samira Ataei et al. AMC: An asynchronous memory compiler, 2019 25th IEEE International Symposium on Asynchronous Circuits and Systems, 2019, 1-8.

Sumanth Kamineni et al. MemGen: An Open-Source Framework for Autonomous Generation of Memory Macros, 2021 IEEE Custom Integrated Circuits Conference, 2021, 1-2.

Dimitrios Antoniadis et al. Open-Source Memory Compiler for Automatic RRAM Generation and Verification, 2021 IEEE International Midwest Symposium on Circuits and Systems, 2021, 97-100.

Jinshan Zhang et al. Alpine: An Agile Processing-in-Memory Macro Compilation Framework, Proceedings of the 2021 on Great Lakes Symposium on VLSI, 2021, 333-338.

Edward Lee et al. A ReRAM Memory Compiler for Monolithic 3D Integrated Circuits in a Carbon Nanotube Process, ACM Journal on Emerging Technologies in Computing Systems, 2021, 18(1), 1-20.

Hao Chen et al. Magical 1.0: An Open-Source Fully-Automated AMS Layout Synthesis Framework Verified With a 40-nm 1GS/s ΔΣ ADC, 2021 IEEE Custom Integrated Circuits Conference, 2021, 1-2.

Jaeduk Han et al. Laygo: A template-and-grid-based layout generation engine for advanced CMOS technologies, IEEE Transactions on Circuits and Systems—I: Regular Papers, 2021, 68(3), 1012-1022.

Kourosh Hakhamaneshi et al. BagNet: Berkeley analog generator with layout optimizer boosted with deep neural networks, 2019 IEEE/ACM International Conference on Computer-Aided Design, 2019, 1-8.

Kishor Kunal et al. Align: Open-source analog layout automation from the ground up, Proceedings of the 56th Annual Design Automation Conference, 2019, 1-4.

Yiyao GE et al. Phase-Selective Epitaxial Growth of Heterophase Nanostructures on Unconventional 2H-Pd Nanoparticles, J. Am. Chem. Soc., 2020, 142, 18971-18980.

Yu Zhang et al. Maximizing the Catalytic Performance of Pd@AuxPd1-x Nanocubes in H2O2 Production by Reducing Shell Thickness to Increase Compositional Stability, Angewandte Chemie International Edition, 2021, 60, 19643-19647.

Peter Adeniyi Alaba et al. A review of recent progress on electrocatalysts toward efficient glycerol electrooxidation, Reviews in Chemical Engineering, 2020, 37, 779-811.

Yan Li et al. Nickel-molybdenum nitride nanoplate electrocatalysts for concurrent electrolytic hydrogen and formate productions, Nature Communications, 2019, 10, 5335.

Yuhou Pei et al. Glycerol oxidation-assisted electrochemical CO2 reduction for the dual production of formate, Journal of Materials Chemistry A, 2022, 10, 1309-1319.

You Xu et al. Integrating electrocatalytic hydrogen generation with selective oxidation of glycerol to formate over bifunctional nitrogen-doped carbon coated nickel-molybdenum-nitrogen nanowire arrays, Applied Catalysis B: Environmental, 2021, 298, 120493.

Ge Ma et al. The electrochemical reforming of glycerol at Pd nanocrystals modified ultrathin NiO nanoplates hybrids: An efficient system for glyceraldehyde and hydrogen coproduction, Nano Research, 2022, 15, 1934-1941.

Linfeng Fan et al. High Entropy Alloy Electrocatalytic Electrode toward Alkaline Glycerol Valorization Coupling with Acidic Hydrogen Production, J. Am. Chem. Soc., 2022, 144, 7224-7235.

Rihab Boukil et al. Enhanced electrocatalytic activity and selectivity of glycerol oxidation triggered by nanoalloyed silver-gold nanocages directly grown onto gas diffusion electrodes, Journal of Materials Chemistry A, 2020, 8, 8848-8856.

Binh Thi Xuan Lam et al. Preparation of PdAg and PdAu nanoparticle-loaded carbon black catalysts and their electrocatalytic activity for

(56) References Cited

OTHER PUBLICATIONS the glycerol oxidation reaction in alkaline medium, Journal of Power Sources, 2015, 297, 149-157.

Suping Li et al. Designed Multimetallic Pd Nanosponges with Enhanced Electrocatalytic Activity for Ethylene Glycol and Glycerol Oxidation, Energy & Environmental Science, 2016, 9, 3097-3102.

Zhiyong Zhang et al. Supported Pt, Pd and Au nanoparticle anode catalysts for anion-exchange membrane fuel cells with glycerol and crude glycerol fuels, Applied Catalysis B: Environmental, 2013, 136-137, 29-39.

* cited by examiner

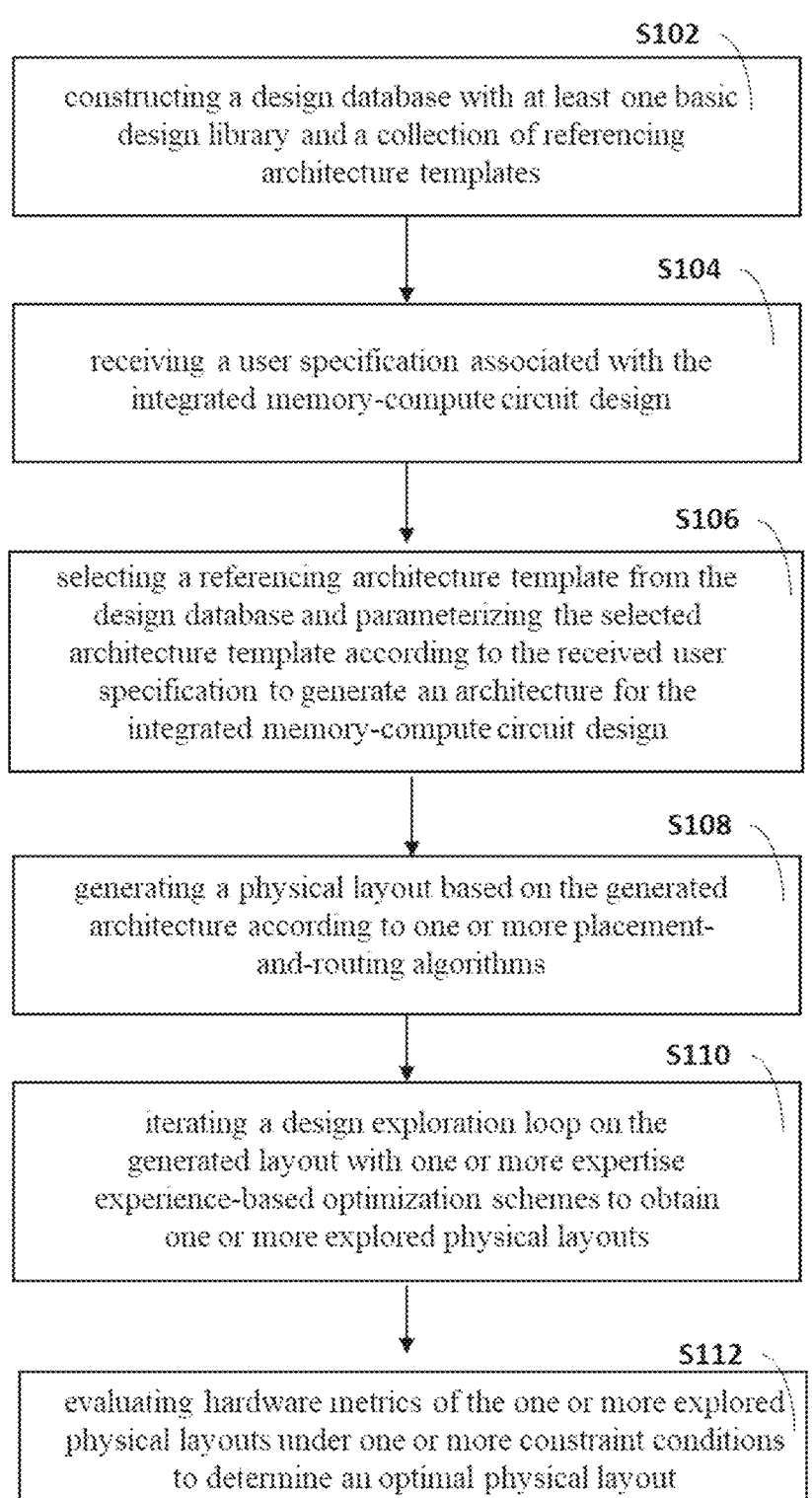

S102 constructing a design database with at least one basic design library and a collection of referencing architecture templates

S104 receiving a user specification associated with the integrated memory-compute circuit design

S106 selecting a referencing architecture template from the design database and parameterizing the selected architecture template according to the received user specification to generate an architecture for the integrated memory-compute circuit design

S108 generating a physical layout based on the generated architecture according to one or more placement-and-routing algorithms

S110 iterating a design exploration loop on the generated layout with one or more expertise experience-based optimization schemes to obtain one or more explored physical layouts

S112 evaluating hardware metrics of the one or more explored physical layouts under one or more constraint conditions to determine an optimal physical layout

FIG. 1

Same Width for the Weight Cell and Bitwise Multiplier

**Bitwise Multiplication Product = IN_B *NOR* Q_B**

2nd Stage
5b adder

1st Stage
4b Adder

3rd Stage
6b adder (a) W-oriented Partitioning   (b) H-oriented Partitioning   (c) H&W-oriented Partitioning ▓ DCIM Subarray   ░ Subarray Driver, Shift Accumulator   ☐ Precision Fusion Unit   ▓ Controller (a) DCIM Macro without Array Partitioning (b) DCIM Macro with H-oriented Array Partitioning

1

AUTOMATIC COMPILATION METHOD AND FRAMEWORK FOR GENERATING A LAYOUT OF INTEGRATED MEMORY-COMPUTE CIRCUIT

COPYRIGHT NOTICE

FIELD OF THE INVENTION

The present disclosure relates to integrated memory-compute circuit design, and more particularly to an automatic compilation method and framework for generating a layout for an integrated memory-compute circuit design.

BACKGROUND OF THE INVENTION

Computing-in-Memory (CIM) architecture has been recognized as a promising computing paradigm for efficient artificial intelligence (AI) computing. The conventional digital architecture usually has massive data movement between its separate compute and memory. CIM tackles the memory wall issues by integrating multiply-accumulation (MAC) operations into static random access memory (SRAM) or non-volatile memory.

In recent years, digital CIM (DCIM) becomes an emerging type of CIM architecture. DCIM embeds digital MAC computing logic into SRAM memory in a distributed manner, unlike analog CIM (ACIM) that usually relies on current/voltage summation along columns of memory array for MAC computing. Besides the benefits of CIM architecture, DCIM does not have DAC or ADC overhead, and the full-digital computing does not suffer from non-ideal analog issues. Therefore, DCIM is a high-efficiency and high-precision architecture with strong technology scaling capability.

However, since DCIM-like circuit is a compact mixture of memory and digital logic, the currently existing RTL-based digital design flow cannot be directly applied to such integrated memory-compute circuit implementation. Current DCIM designs heavily rely on manual efforts. People design a DCIM macro architecture from basic memory cells, bitwise multipliers, up to the whole array. The physical layout must be carefully optimized to meet certain user specifications (architecture parameters like macro height and width, and hardware constraints like area and latency). Once the specifications change, the time-consuming manual design flow should run again, which limits application of DCIM to various AI applications.

Currently, on one hand, some memory compilers have been used to generate arbitrary memory arrays automatically. However, most of them are foundry-provided or open-source SRAM memory compilers (e.g., OpenRAM) are not applicable because they only generate SRAM memory only for read and write without computing capability. On the other hand, some circuit layout generators have also been reported to generate analog circuit modules automatically. For example, OpenSAR was developed for automatically designing SAR ADC-based analog building blocks such as Sample&Hold circuits and comparators. However, these prior circuit layout generator related reports only address the traditional circuit design issues and cannot meet the requirements of integrated memory-compute circuit.

Therefore, it is desirable to have an agile DCIM-type circuit implementation to build up a good ecosystem for DCIM-type-based AI computing.

SUMMARY OF THE INVENTION

It is an objective of the present invention to provide an automatic compilation method and framework to solve the aforementioned technical problems.

In accordance with a first aspect of the present invention, an automatic compilation method for generating a layout for an integrated memory-compute circuit design is provided. The automatic compilation method comprises: constructing a design database with at least one basic design library and a collection of referencing architecture templates; receiving a user specification associated with the integrated memory-compute circuit design; selecting a referencing architecture template from the design database and parameterizing the selected architecture template according to the received user specification to generate an architecture for the integrated memory-compute circuit design; generating a physical layout based on the generated architecture according to one or more placement-and-routing algorithms; iterating a design exploration loop on the generated layout with one or more expertise experience-based optimization schemes to obtain one or more explored physical layouts; and evaluating hardware metrics of the one or more explored physical layouts to determine an optimal physical layout.

In accordance with a second aspect of the present invention, an automatic compilation framework for generating a layout for an integrated memory-compute circuit design is provided. The automatic compilation framework comprises: a database constructed with at least one basic design library and a collection of referencing architecture templates; an automatic layout generator comprising: an architecture generator configured to: receive a user specification associated with the integrated memory-compute circuit design; select a referencing architecture template from the design database and parameterize the selected architecture template according to the received user specification to generate an architecture for the integrated memory-compute circuit design; and a placement & routing processor configured to: generate a physical layout based on the generated architecture according to one or more placement-and-routing algorithms. The framework further comprises a design explorer configured to iterate a design exploration loop on the generated layout with one or more expertise experience-based optimization schemes to obtain one or more explored physical layouts; and a hardware performance evaluator configured to evaluate hardware metrics of the one or more explored physical layouts under one or more constraint conditions to determine an optimal physical layout.

The present invention provides a solution for the automatic generation of integrated memory-compute circuits which achieves numerous energy efficiency improvement compared with traditional computing architecture. On one hand, present invention provides the automatic generation of emerging integrated memory-compute circuits, which cannot be implemented with existing memory compilers and other traditional circuit generators. On the other hand, the present invention combines the automatic tools with expert's experience to provide a fast and accurate generation with acceptable performance to meet the user's requirements.

BRIEF DESCRIPTION OF THE DRAWINGS

Embodiments of the invention are described in more details hereinafter with reference to the drawings, in which:

FIG. 1 depicts a flowchart of an automatic compilation method for generating a layout for an integrated memory-compute circuit design according to one embodiment of the present invention;

DETAILED DESCRIPTION

In the following description, embodiments of automatic compilation framework and method for generating a layout for an integrated memory-compute circuit design are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 2:
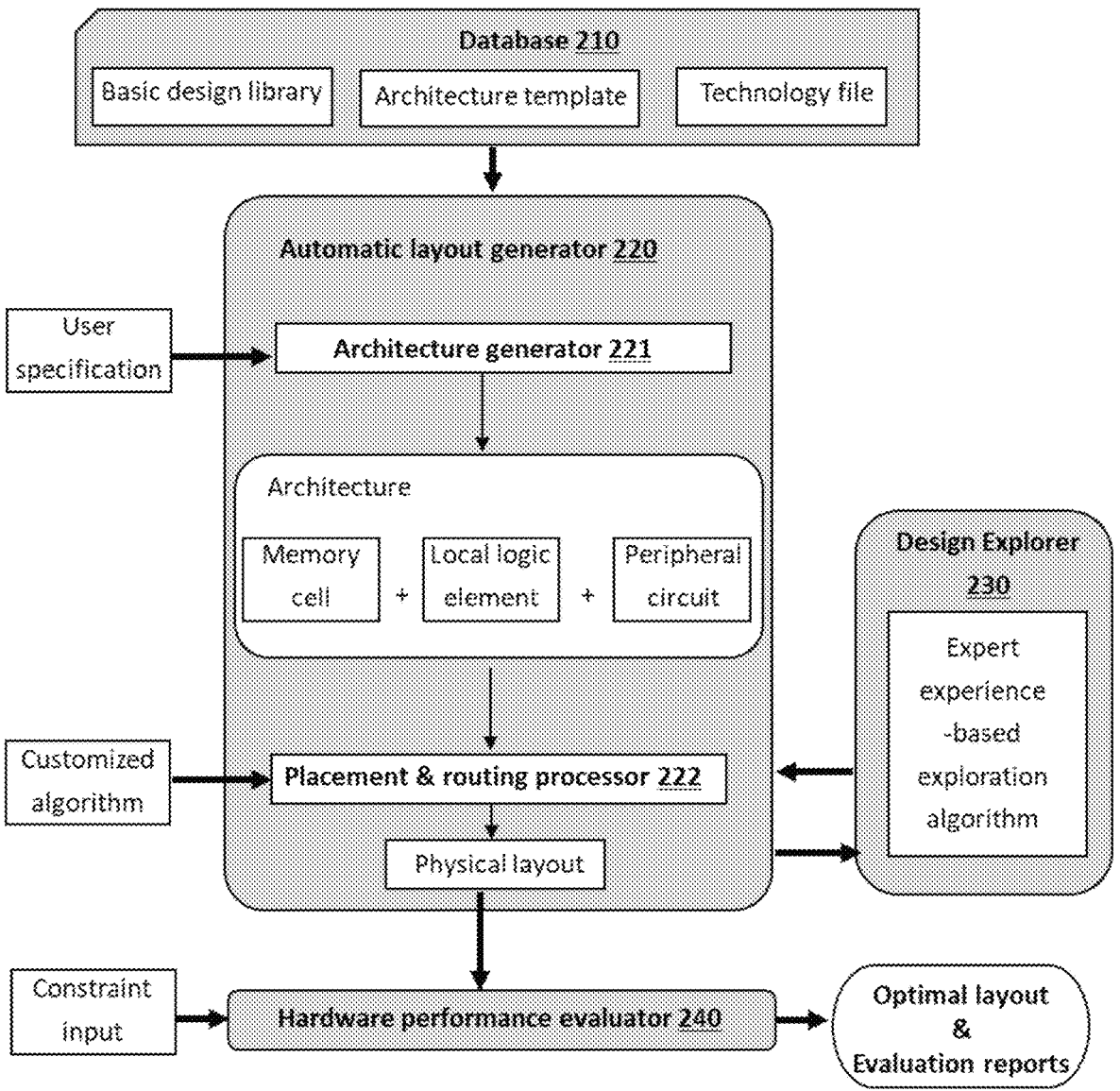
FIG. 2 depicts a block diagram of an automatic compilation framework for implementing the automatic compilation method.

FIG. 1 illustrates a flowchart of an automatic compilation method for generating a layout for an integrated memory-compute circuit design according to one embodiment of the present invention. FIG. 2 depicts a block diagram of an automatic compilation framework for implementing the automatic compilation method.

Referring to FIG. 1, the automatic compilation method comprises:

Step S102: constructing a design database with at least one basic design library and a collection of referencing architecture templates;

Step S104: receiving a user specification associated with the integrated memory-compute circuit design;

Step S106: selecting a referencing architecture template from the design database and parameterizing the selected architecture template according to the received user specification to generate an architecture for the integrated memory-compute circuit design;

Step S108: generating a physical layout based on the generated architecture according to one or more placement-and-routing algorithms;

Step S110: iterating a design exploration loop on the generated layout with one or more expertise experience-based optimization schemes to obtain one or more explored physical layouts; and Step 112: evaluating hardware metrics of the one or more explored physical layouts to determine an optimal physical layout.

Referring to FIG. 2, the automatic compilation framework may be composed of a design database 210, an automatic layout generator 220, a design explorer 230, and a hardware performance evaluator 240.

The design database 210 may include a basic design library, a collection of referencing architecture templates and necessary technology files such as standard design checking rules (DRC) and layout versus schematic (LVS) rules, and so on.

The basic design library may include designs of various customized functional units such as memory cells, local logic elements for the partial integrated memory-compute functional unit, and peripheral computing circuit elements.

The referencing architecture templates may be abstracted from expert experience-based or user-defined designs. The basic design library and top-layer architecture templates are the basic requirements to provide a fast and accurate circuit generation solution.

The automatic layout generator 220 may include an architecture generator 221 and a placement and routing processor 222.

The architecture generator 221 may be configured to: receive a user specification associated with the integrated memory-compute circuit design; select a referencing architecture template from the design database and parameterize the selected architecture template according to the received user specification to generate an architecture for the integrated memory-compute circuit design.

The user specification may include a computer readable code and one or more constraints associated with the integrated memory-compute circuit design. The selected architecture may include memory cells, local logic element and peripheral circuit elements.

The placement and routing processor 222 may be configured to: generate a physical layout based on the generated architecture according to one or more placement-and-routing algorithms.

The design explorer 230 may be configured to iterate a design exploration loop on the generated layout with one or more expertise experience-based optimization schemes to obtain one or more explored physical layouts such that the circuit quality and the electrical performance like critical paths and parasitic effects, layout density, and so on, of the physical layout can be optimized. Various integration schemes of basic modules will affect the overall performance, like different bank sizes, partitioning method and so on.

The hardware performance evaluator may be configured to hardware metrics of the one or more explored physical layouts under constraint conditions to determine an optimal physical layout and generate corresponding performance report. The constraint conditions may include area-priority or critical path latency-priority.

Figure 3:
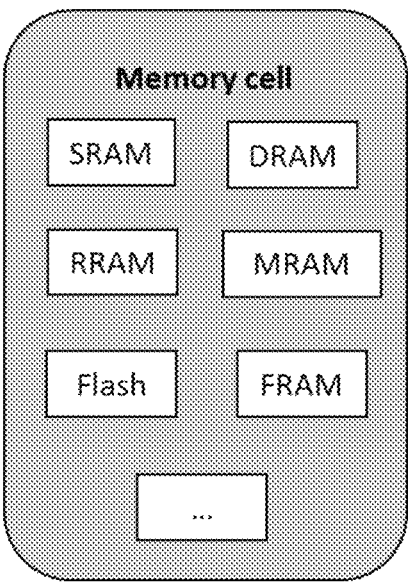
FIG. 3 depicts the embodiments of memory cells in present invention.

Referring to FIG. 3, specifically, the memory cells may include, but are not limited to, volatile memory cells, including SRAM, dynamic random-access memory (DRAM) and variants thereof, and non-volatile memory cells, including flash memory, resistive random-access memory (RRAM), magnetoresistive random-access memory (MRAM), ferroelectric random-access memory (FRAM) and variants thereof.

Figure 4:
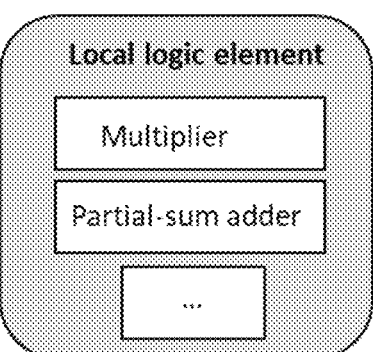
FIG. 4 depicts the embodiments of local logic elements in present invention.

Referring to FIG. 4, the local logic elements may include, but are not limited to, multiplier, partial-sum adder and any other suitable functional logic computing circuits.

Figure 5:
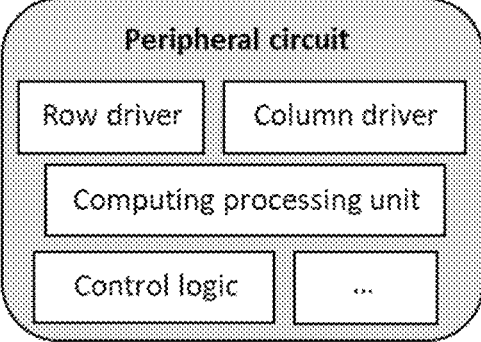
FIG. 5 depicts the embodiments of peripheral circuits in present invention.

Referring to FIG. 5, the peripheral circuits may include, but are not limited to, row driver, column driver, computing processing unit, control logic, shift accumulator, precision fusion unit, and any other suitable functional modules.

Figure 6:
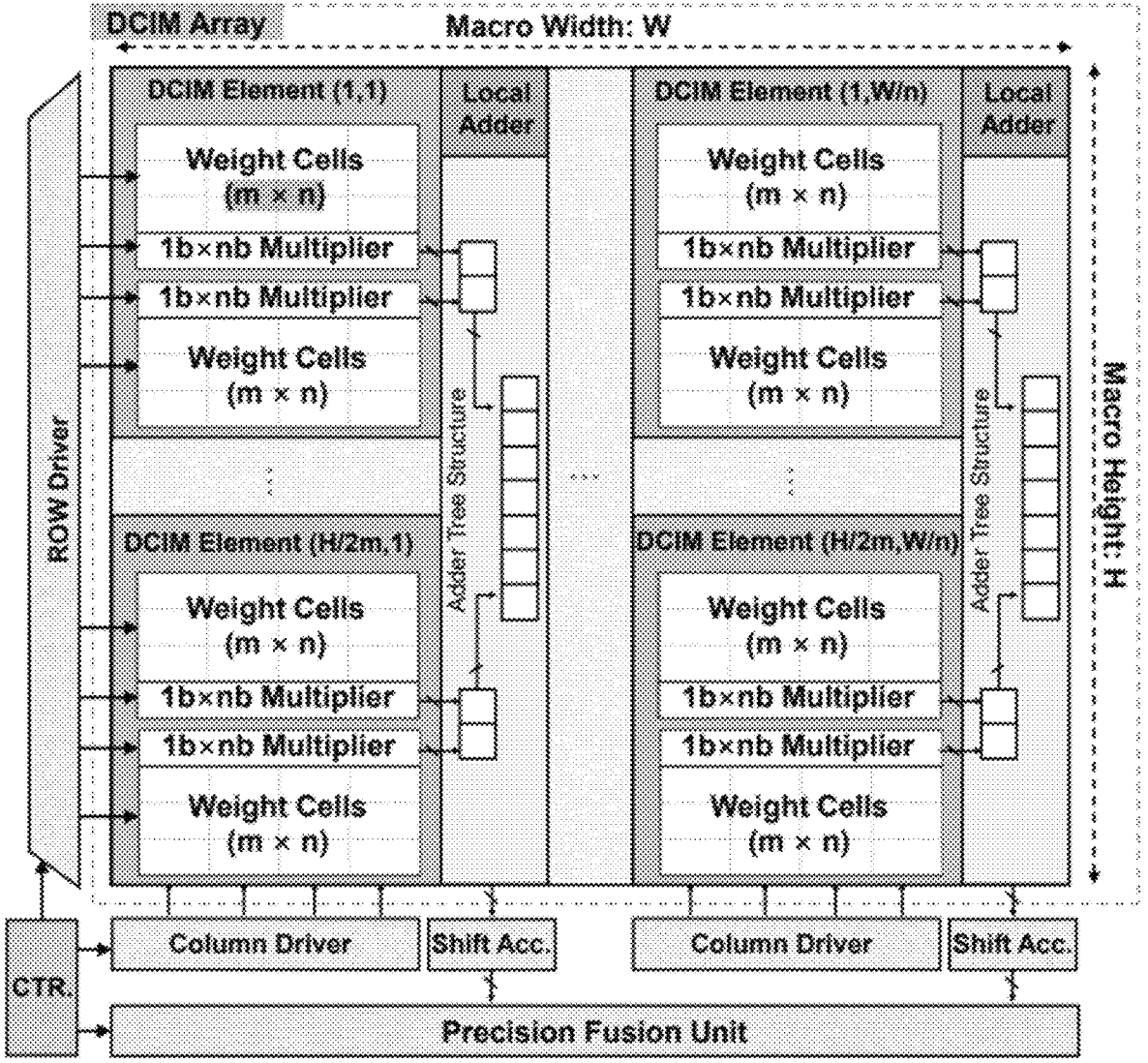
FIG. 6 depicts an exemplary architecture template of an integrated memory-compute circuit according to one embodiment of the present invention.

FIG. 6 illustrates an exemplary architecture template of an integrated memory-compute circuit, a SRAM-based H×W DCIM macro, according to one embodiment of the present invention. The template is parameterized to expose a large design space for various user defined DCIM specifications.

The DCIM macro is composed of a DCIM array and digital peripheral circuits (row/column driver, shift accumulator, precision fusion unit, and controller). The DCIM array consists of multiple columns of DCIM elements and their local adders. When computing a matrix multiplication in the AI model, the DCIM stores the weight matrix in the SRAM cells of the DCIM array and loads the input matrix through the row driver. The DCIM elements receive inputs and perform local MAC operations. The array's outputs are sent to the shift accumulators and post-processing circuit to obtain the results.

The components of the H×W DCIM macro are further presented as follows: DCIM element is a DCIM array's basic building block that has two groups of m×n SRAM-based weight cells and 1b×nb multipliers. The two groups are placed face to face for a compact physical layout. The DCIM element width (n) equals the maximum granularity for constructing the supported weight precisions. For example, if 8b and 12b weight precisions are required for the macro, n should be 4 to construct the two precisions with 2 and 3 DCIM elements in the horizontal direction. The weight-multiplier ratio (m) can be defined in the user specifications. It allows m rows of weight cells to reuse one 1b×nb multiplier. Therefore, in a DCIM macro with H rows and W columns of SRAM cells, W/n DCIM elements per row are placed horizontally matching the macro width, and H/2m DCIM elements per column are placed vertically to match the macro height.

Local adder is the building block placed beside every column of DCIM elements for adding up their products vertically. The local adder has a tree structure determined by H and n. Specifically, the local adder's input product has n bits, and the last-stage output has $\log\_2(H/m)+n$ bits.

Row driver provides word line-direction input signals, for both weight programming and parallel in-memory computing. It includes a row address decoder, a signal buffer, and a multiplexer to select one row from the m×n weight cells. Column driver writes the bit line signals into the SRAM cells in DCIM's weight programming phase.

Shift Accumulator receives the output from the local adder in DCIM's in-memory computing phase. Since inputs are fed to the DCIM in a bit-serial manner with multiple cycles, the shift accumulator collects the partial sum value for one input bit per cycle and then performs shift-and-add function to obtain the MAC value for full input precision.

A precision fusion unit is designed on the bottom of a DCIM macro to support variable weight precisions defined in the user specifications. Since the DCIM element only performs computation on n-bit weights, this unit fuses the outputs from multiple shift accumulators to obtain the final MAC results for full weight precision. Take 8b weight precision as an example. The precision fusion unit is configured as fusing the outputs of every 2 shift accumulators.

Controller (CTR.) configures the DCIM macro as the weight programming or in-memory computing phase and enables the corresponding components in each phase.

Figure 7A:
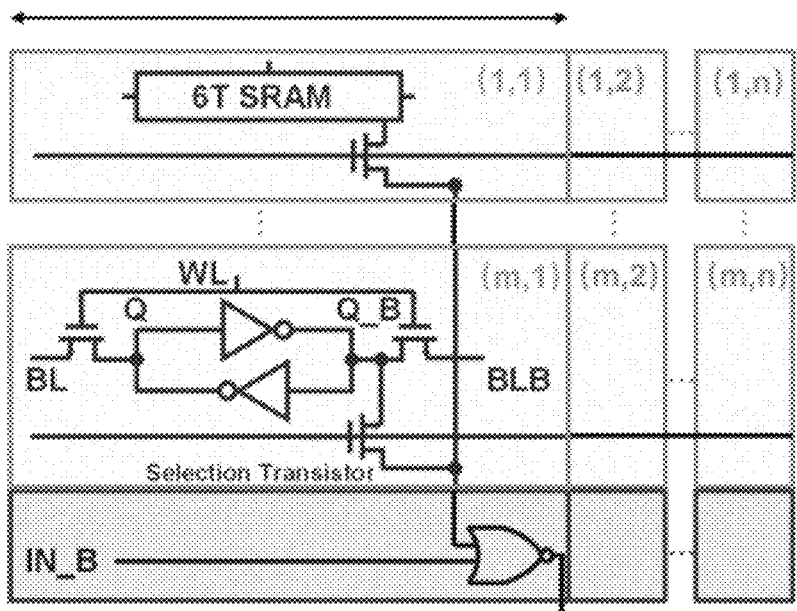
FIG. 7A depicts the column template with m weight cells and one bitwise multiplier.
Figure 7B:
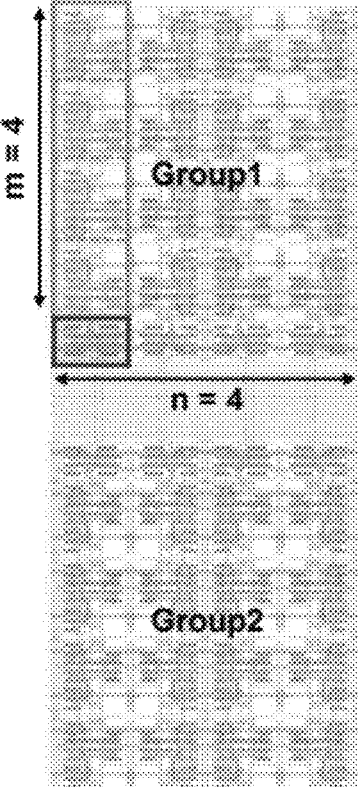
FIG. 7B depicts how a DCIM element layout is generated by the automatic compilation framework with m=4, n=4.

FIGS. 7A and 7B illustrate a customized placing and routing example of a DCIM element circuit in FIG. 6. FIG. 7A shows the column template with m weight cells and one bitwise multiplier. FIG. 7B illustrates how a DCIM element layout is generated by the automatic compilation framework with m=4, n=4.

The DCIM element is the basic building block that has two groups of m×n weight cells and 1b×nb multipliers. The automatic compilation framework generates DCIM elements by following a template based on the SRAM-based weight cell and the bitwise multiplier from the customized cell library.

FIG. 7A shows the column template with m weight cells and one bitwise multiplier. The weight bit (Q) is stored in a 6 T SRAM cell. Bitwise multiplication is realized by a 4 T NOR gate. To support a variable weight-multiplier ratio of m in the same template, an NMOS-based selection transistor is added between the weight cell's Q_B node and one input port of the bitwise multiplier. The other input port reads the inverse of the input bit (IN_B).

FIG. 7B illustrates how a DCIM element layout is generated by the automatic compilation framework with m=4, n=4. The automatic compilation framework first generates one group of m×n weight cells and a 1b×nb multiplier, and then placed the two groups face to face. Each group is generated by setting m=4 for a column template and repeating n=4 times horizontally. In the DCIM element template, the weight cells in a row share the same selection signal which is controlled by the row driver. During the in-memory computing phase, one row of weights is selected and multiplied by the input via the 1b×nb multiplier. To ensure high compactness for the automated DCIM element generation, the layouts of the SRAM cell and NOR gate are designed with the same width between the power lines. Thus, they can be connected vertically and extended horizontally with little waste of area. The automatic compilation framework has strong scalability for new DCIM techniques in this emerging field. The DCIM element template can be easily extended by adding new cell designs in the library.

Figure 8A:
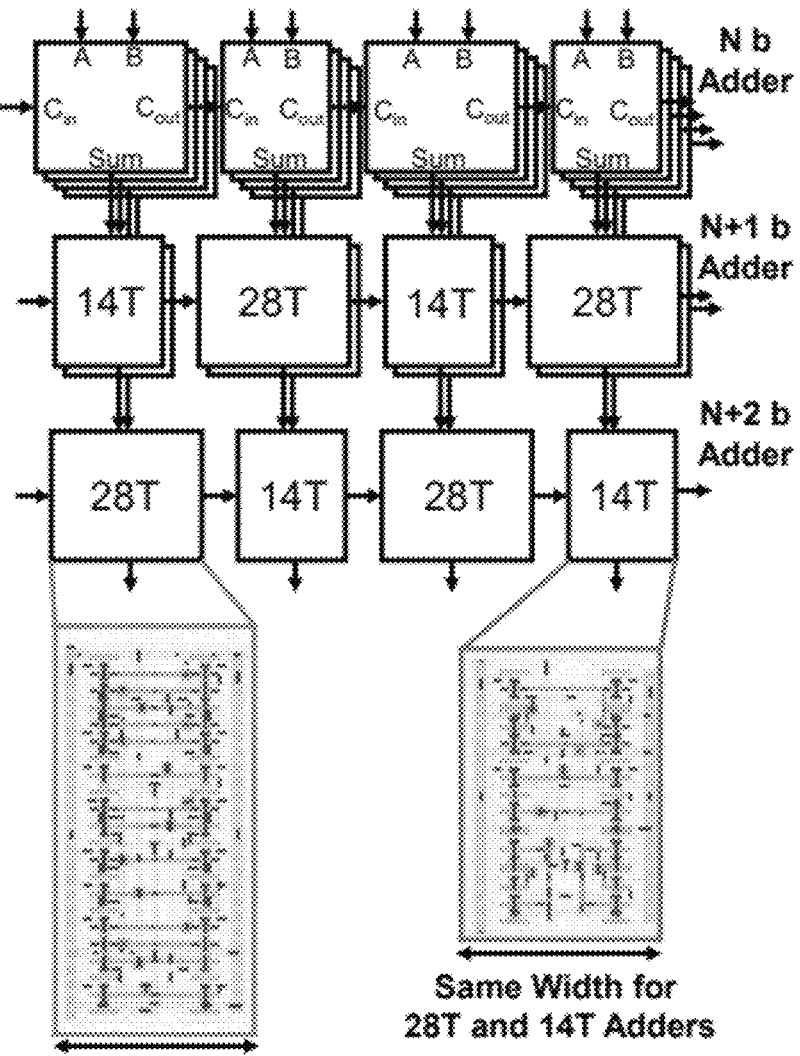
FIG. 8A depicts a local adder template and FIG. 8B shows an example local adder generated by the automatic compilation framework by following the template of FIG. 8A.
Figure 8B:
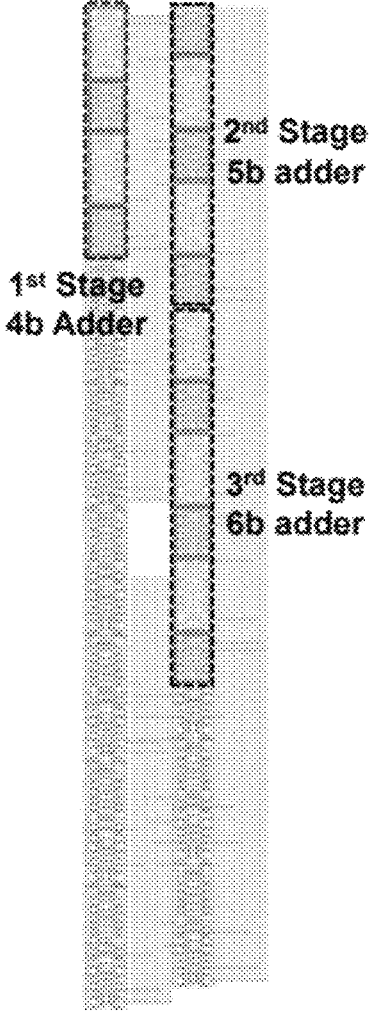

FIGS. 8A and 8B illustrate a customized placing and routing example of a local adder tree circuit in FIG. 6. FIG. 8A shows a local adder template and FIG. 8B shows an example local adder generated by the automatic compilation framework by following the template of FIG. 8A.

The local adder is the basic building block that adds up the products of DCIM elements in one column. Referring to FIG. 8A, the automatic compilation framework generates local adders by following a template of tree structure determined by H, m, n. The local adder template derives from the optimized adder tree with interleaved 28 T and 14 T full adders (in TSMC's 22 nm DCIM design), which improves 30% energy efficiency than using just 28 T adders. 28 T and 14 T bitwise full adders are created in the customized cell library, so the automatic compilation framework can generate any local adder architectures once given the parameters H, m, n. To guarantee high compactness after stacking 28 T and 14 T adders in one stage of the adder tree, the two customized cells are designed with the same width in layout.

Design rules are set to the local adder's layout to shape it in a compact rectangle. The total height is the same as the DCIM element column in one subarray. An intuitive adder tree layout usually looks like a pyramid with more area in the early stages and less area in the late stages, which would cause large area waste if the layout were directly integrated between DCIM elements.

FIG. 8B shows an example local adder generated by the automatic compilation framework. The adder tree structure has four 4b full adders in the first stage, two 5b full adders in the second stage, and one 6b full adder in the third stage. The automatic compilation framework's design rules constrain the late stage's placement and place the 5b and 6b adders in the same column, thus matching the total height of the first-stage 4b adders. In this way, the layout of the adder tree can be compressed in a rectangle fully utilizing the area in a DCIM macro.

Figure 9:
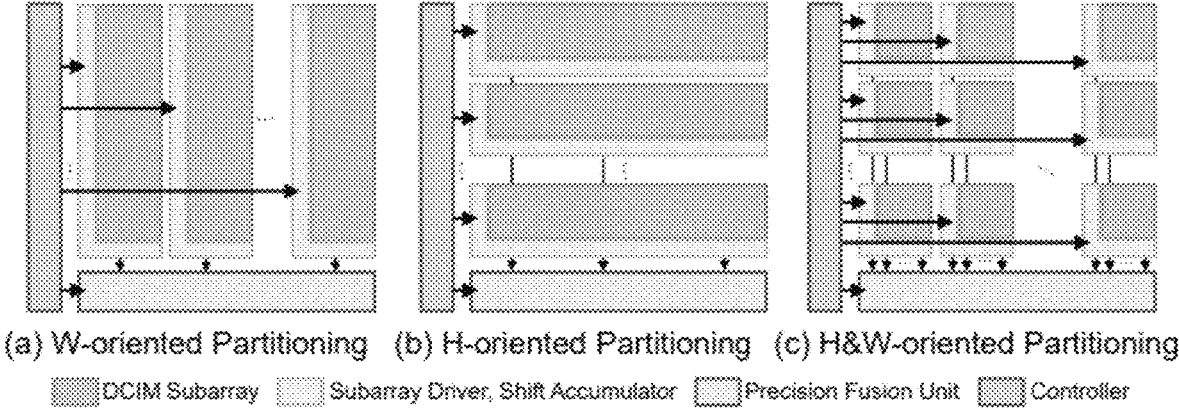
FIG. 9 depicts expert-based design exploration with three different types of array partition schemes according to one embodiment of the present invention.

FIG. 9 illustrates expert-based design exploration with three different types of array partition schemes according to one embodiment of the present invention.

Partitioning a DCIM array into different subarray granularities can achieve trade-offs among area, latency, and energy efficiency. An H×W DCIM macro can be realized with multiple subarrays. After array partitioning, row/column drivers and shift accumulators are distributed near subarrays, while the DCIM function is the same as the baseline architecture.

The architecture changes lead to a new DCIM layout with different areas, latency, and energy efficiency. In a smaller subarray granularity, the critical path latency for in-memory computing is usually shorter. However, more wiring and peripheral cost are produced between subarrays, which may increase power consumption and reduce energy efficiency. Therefore, the automatic compilation framework is developed through a layout exploration loop to compare different subarray granularities. For each iteration, the automatic compilation framework runs a macro generation process. Each generated DCIM macro's hardware metrics are evaluated. After the exploration is finished, the automatic compilation framework finds out the optimal DCIM macro that meets the hardware constraints.

Referring to FIG. 9, for easier exploration and comparison, three types of partitioning schemes (W-oriented, H-oriented, H&W-oriented) are illustrated. W-oriented partitioning only divides the horizontal direction, so the word line critical path is reduced. H-oriented partitioning only divides the vertical direction, which reduces the input product count and stage count of a local adder. H&W-oriented partitioning divides both the vertical and horizontal directions with more complicated trade-offs.

Figure 10A:
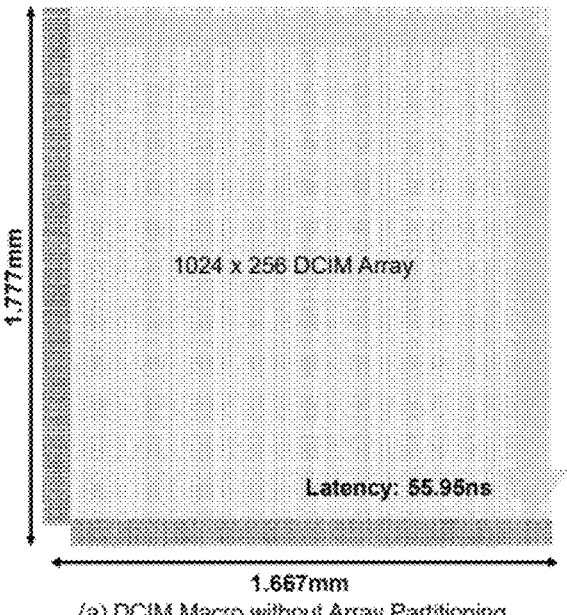
FIGS. 10A and 10B illustrate two physical layout examples with and without array partitioning respectively.
Figure 10B:
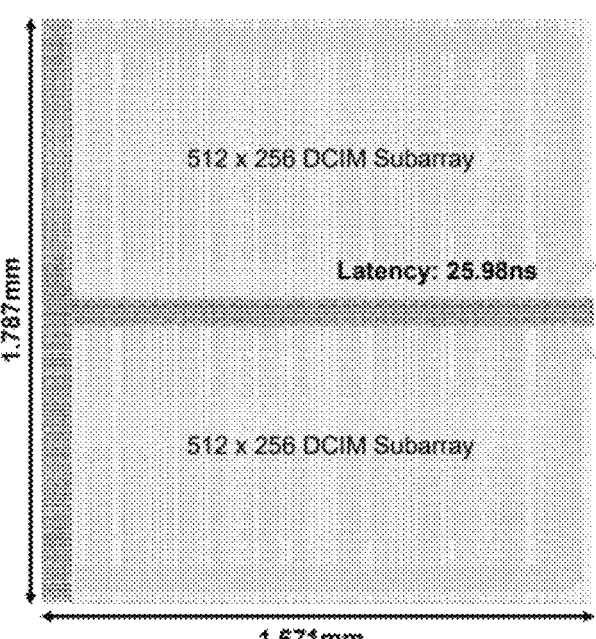

FIGS. 10A and 10B illustrate two physical layout examples with and without array partitioning respectively. FIG. 10A shows a 1024×256 DCIM macro without array partitioning, with macro area of 1.777×1.667=2.962 mm². The critical path latency is 55.95 ns, and the energy efficiency is 43.4 TOPS/W at 1.1V. FIG. 10B shows a 1024×256 H-oriented partitioning scheme which achieves the highest energy efficiency (74.7 TOPS/W) at the same voltage.

The efficiency improvement mainly comes from the shorter critical path (25.98 ns) after H-oriented partitioning, which simplifies the local adder hierarchy. Overall, the various results on the above hardware metrics prove the necessity of the automatic compilation framework's layout exploration loop. For certain user specifications, the design space should be carefully explored, which is hard for conventional manual DCIM design.

The functional units and modules in accordance with the embodiments disclosed herein may be implemented using computing devices, computer processors, or electronic circuitries including but not limited to application specific integrated circuits (ASIC), field programmable gate arrays (FPGA), microcontrollers, and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

All or portions of the methods in accordance to the embodiments may be executed in one or more computing devices including server computers, personal computers, laptop computers, mobile computing devices such as smartphones and tablet computers.

The embodiments may include computer storage media, transient and non-transient memory devices having computer instructions or software codes stored therein, which can be used to program or configure the computing devices, computer processors, or electronic circuitries to perform any of the processes of the present invention. The storage media, transient and non-transient memory devices can include, but are not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

Each of the functional units and modules in accordance with various embodiments also may be implemented in distributed computing environments and/or Cloud computing environments, wherein the whole or portions of machine instructions are executed in distributed fashion by one or more processing devices interconnected by a communication network, such as an intranet, Wide Area Network (WAN), Local Area Network (LAN), the Internet, and other forms of data transmission medium.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. An automatic compilation method for generating a layout for an integrated memory-compute circuit design, the method comprising:

constructing a design database with at least one basic design library and a collection of referencing architecture templates;

receiving a user specification associated with the integrated memory-compute circuit design;

selecting a referencing architecture template from the design database and parameterizing the selected architecture template according to the received user specification to generate an architecture for the integrated memory-compute circuit design;

generating a physical layout based on the generated architecture according to one or more placement-and-routing algorithms;

iterating a design exploration loop on the generated layout with one or more expertise experience-based optimization schemes to obtain one or more explored physical layouts; and evaluating hardware metrics of the one or more explored physical layouts under one or more constraint conditions to determine an optimal physical layout.

2. The automatic compilation method according to claim 1, wherein the basic design library includes designs of memory cells, local logic elements and peripheral circuits.

3. The automatic compilation method according to claim 2, wherein the memory cells are volatile memory cells or non-volatile memory cells.

4. The automatic compilation method according to claim 2, wherein the local logic elements include multiplier and/or partial-sum adder.

5. The automatic compilation method according to claim 2, wherein the peripheral circuits include row/column driver, shift accumulator, precision fusion unit, and/or controller.

6. The automatic compilation method according to claim 1, wherein the referencing architecture templates include architecture templates abstracted from expert experience-based or user-defined architecture designs.

7. The automatic compilation method according to claim 1, wherein the user specification includes a computer readable code and one or more constraints on the integrated memory-compute circuit design.

8. The automatic compilation method according to claim 1, wherein the expertise experience-based optimization schemes include one or more memory cell array partitioning schemes.

9. The automatic compilation method according to claim 8, wherein the one or more memory cell array partitioning schemes have different subarray granularities of partitioning or different orientation of partitioning.

10. The automatic compilation method according to claim 1, wherein the one or more constraint conditions include area-priority condition or critical path latency-priority condition.

11. An automatic compilation framework for generating a layout for an integrated memory-compute circuit design, the framework comprising:

a database constructed with at least one basic design library and a collection of referencing architecture templates;

an automatic layout generator comprising:

an architecture generator configured to: receive a user specification associated with the integrated memory-compute circuit design; select a referencing architecture template from the design database and parameterize the selected architecture template according to the received user specification to generate an architecture for the integrated memory-compute circuit design; and a placement & routing processor configured to: generate a physical layout based on the generated architecture according to one or more placement-and-routing algorithms;

a design explorer configured to iterate a design exploration loop on the generated layout with one or more expertise experience-based optimization schemes to obtain one or more explored physical layouts; and a hardware performance evaluator configured to evaluate hardware metrics of the one or more explored physical layouts under one or more constraint conditions to determine an optimal physical layout.

12. The automatic compilation framework according to claim 11, wherein the basic design library includes designs of memory cells, local logic elements and peripheral circuits.

13. The automatic compilation framework according to claim 12, wherein the memory cells are volatile memory cells or non-volatile memory cells.

14. The automatic compilation framework according to claim 12, wherein the local logic elements include multiplier and/or partial-sum adder.

15. The automatic compilation framework according to claim 12, wherein the peripheral circuits include row/column driver, shift accumulator, precision fusion unit, and/or controller.

16. The automatic compilation framework according to claim 11, wherein the referencing architecture templates include architecture templates abstracted from expert experience-based or user-defined architecture designs.

17. The automatic compilation framework according to claim 11, wherein the user specification includes a computer readable code and one or more constraints on the integrated memory-compute circuit design.

18. The automatic compilation framework according to claim 11, wherein the expertise experience-based optimization schemes include one or more memory cell array partitioning schemes.

19. The automatic compilation framework according to claim 18, wherein the one or more memory cell array partitioning schemes have different subarray granularities of partitioning or different orientation of partitioning.

20. The automatic compilation framework according to claim 11, wherein the one or more constraint conditions include area-priority condition or critical path latency-priority condition.

* * * * *